(12) United States Patent
Bailey

(10) Patent No.: US 6,840,974 B2
(45) Date of Patent: Jan. 11, 2005

(54) SELF-CLEANING FILTER

(75) Inventor: George R. Bailey, Gaithersburg, MD (US)

(73) Assignee: Spirent Communications of Rockville, Inc., Rockville, MD (US)

( * ) Notice: Subject to any disclaimer, the term of this patent is extended or adjusted under 35 U.S.C. 154(b) by 0 days.

(21) Appl. No.: 10/387,864

(22) Filed: Mar. 14, 2003

(65) Prior Publication Data

US 2004/0177757 A1 Sep. 16, 2004

(51) Int. Cl.[7] .......................... B01D 29/70; B01D 29/72
(52) U.S. Cl. .......................... 55/385.6; 55/283; 55/292; 55/304; 55/467; 96/421; 96/422; 454/187; 454/192; 361/695; 361/681; 361/682
(58) Field of Search .......................... 55/283, 292, 304, 55/385.6, 467; 96/421, 422; 454/187, 192; 361/695, 681, 682

(56) References Cited

U.S. PATENT DOCUMENTS

| 3,589,520 | A | | 6/1971 | Thorne |
|---|---|---|---|---|
| 3,887,341 | A | | 6/1975 | Sutter |
| 4,481,021 | A | | 11/1984 | Kinney, Jr. et al. |
| 4,521,230 | A | | 6/1985 | Strong |
| 4,838,902 | A | | 6/1989 | Lomax |
| 4,950,313 | A | | 8/1990 | Dullien et al. |
| 4,971,026 | A | | 11/1990 | Fineblum |
| 5,843,206 | A | | 12/1998 | Dehn et al. |
| 5,906,752 | A | | 5/1999 | Williams |
| 6,544,309 | B1 | * | 4/2003 | Hoefer et al. .................. 55/283 |
| 6,660,055 | B2 | * | 12/2003 | How et al. .................. 55/385.2 |

* cited by examiner

Primary Examiner—Minh-Chau T. Pham
(74) Attorney, Agent, or Firm—Gilberto M. Villacorta; Andrew J. Bateman; Katten Muchin Zavis Rosenman

(57) ABSTRACT

A self-cleaning filter and cooling system are disclosed for filtering ambient air used to cool the interior of an equipment enclosure. The system includes an enclosure for housing predetermined equipment to be cooled, the enclosure including an air intake port and an exhaust port. The system includes a blower for causing ambient air to be inducted into the enclosure through the air intake port and expelled from the exhaust port. The system also includes a filter that includes a predetermined filter media that covers the air intake port and the exhaust port. The filter moves relative to the air intake port and the exhaust port. The enclosure and blower are configured so as to create a single air flow path for equipment cooling and for discharging exhaust through the filter media to dislodge any particulate matter entrapped in the filter media.

54 Claims, 3 Drawing Sheets

SELF-CLEANING FILTER

BACKGROUND

1. Field of the Invention

The present invention relates to the field of filter cleaning systems. In particular, the present invention relates to a self-cleaning air filter and cooling system, preferably, for electronic equipment enclosures.

2. Background Information

Telecommunications equipment can be installed in central office environments that are relatively clean and subject to limited temperature extremes. In response to these conditions, such telecommunications equipment was generally designed with relatively open, vertical printed circuit board orientations. These circuit boards were fitted into a card cage and utilized a baffle arrangement configured to promote convective flow of ambient air through the equipment to expel internally-generated heat that could otherwise damage the equipment. This approach was appropriate for the intended environment, required no maintenance, and provided good equipment life expectancies.

Increasing emphasis has been placed on the control of flame-spread during mandated laboratory test fires originating inside and outside of the equipment volumes. A trend has also developed in which equipment complexity has increased while equipment volumes have been reduced. These competing objectives have pushed the convective air flow equipment cooling approach to the engineering limit. Additionally, a significant portion of new equipment is now installed at remote terminals that have relatively dirty environments and that are subject to relatively more severe temperature extremes, for example, −40° C. to +65° C. Under these more harsh conditions, the simple convective approach to expelling equipment heat is inadequate.

One method of addressing the problem of heat dissipation is to enclose the telecommunications equipment in a box and add a small fan or blower inside the equipment volume to circulate the captive air. Such a configuration ensures a reasonably uniform air temperature throughout the interior of the equipment volume. In such a configuration, heat is expelled by conduction through the metallic walls of the equipment housing, and subsequently dissipated to the environment by convective cooling of the entire equipment exterior surface. Since no outside air circulates into the equipment interior, concerns regarding equipment flammability or susceptibility to contamination are reduced. At the same time, the forced circulation in the interior of the equipment volume allows denser circuitry, thereby reducing equipment volume. However, the available equipment surface area is limited, so that even this approach to heat dissipation can be inadequate.

A method of mitigating the exterior surface area limitation includes an additional mechanism to separately circulate ambient air over the exterior surface of the equipment, so that air inside and outside the equipment enclosure do not intermix. In this way, the thermal resistance from the outside surface of the enclosure to the ambient air is greatly reduced, compared with unaided convective cooling. This approach results in the construction of a somewhat complex equipment enclosure with a mechanism to separately move the air interior to and exterior to the equipment enclosure. Such a mechanism can exacerbate the total equipment energy usage.

To avoid contamination, the approach of simply passing external ambient air directly through the equipment requires the use of a filter. The use of a filter, in turn, requires that some maintenance interval be specified consistent with dirt level and filter size constraints. Accordingly, although current equipment standards permit a fan in conjunction with a filter and a specified maintenance interval, in practice, the filter will rarely be changed without regard to the maintenance interval specified, unless there is an equipment failure.

To solve these and other related problems, self-cleaning filter systems have been developed. For example, U.S. Pat. No. 4,971,026 (the '026 patent) discloses a continuous self-cleaning filter for use in a warm air furnace. The system disclosed in the '026 patent requires multiple air flow paths configured with multiple blowers and ducting arrangements, as well as the use of a rotor/stator with radially-rotatable blades. However, such systems are relatively complex and expensive.

Thus, there is a need for a continuous self-cleaning filter for use with various equipment, including telecommunications equipment, that requires little or no maintenance and that is less complex and less expensive than known self-cleaning filter systems.

SUMMARY OF THE INVENTION

A self-cleaning filter and cooling system are disclosed that utilize ambient air to cool the interior of an equipment enclosure. In accordance with exemplary embodiments of the present invention, to simplify the design, the self-cleaning filter and cooling system utilize a single air flow path for both cooling the interior of the equipment enclosure and for cleaning the filter.

According to a first aspect of the present invention, the system comprises an enclosure for housing predetermined equipment to be cooled, the enclosure including an air intake port and an exhaust port. The system comprises a blower for causing ambient air to be inducted into the enclosure through the air intake port, circulated through the interior of the equipment enclosure, and expelled from the exhaust port. The blower is disposed within the equipment enclosure. The system also comprises a filter that includes a predetermined filter media that covers the air intake port and the exhaust port. The filter moves relative to the air intake port and the exhaust port. The enclosure and blower are configured so as to create a single air flow path for equipment cooling and for discharging exhaust through the filter media to dislodge any particulate matter entrapped in the filter media. The cross sectional area of the exhaust port can be reduced relative to the air intake port to increase the air velocity of the exhaust air to improve the performance of the filter. An agitation mechanism can be used that either taps the filter media or rapidly dithers the filter media in addition to or in place of the high velocity exhaust.

According to a second aspect of the present invention, an equipment cooling system comprises an equipment enclosure defining an equipment compartment and configured to carry electronic equipment to be cooled. The equipment compartment is formed with an air intake port and an exhaust port. The system comprises a blower disposed in fluid communication with the air intake port and the exhaust port defining a single air flow path. The system also comprises a filter which simultaneously covers the air intake port and the exhaust port. The filter moves relative to the air intake port and exhaust port. The system is configured so that the exhaust air from the equipment enclosure is directed to a portion of the filter.

According to a third aspect of the present invention, an equipment cooling system comprises an equipment enclosure for housing predetermined equipment to be cooled. The equipment enclosure includes an air intake port and an exhaust port. The system comprises a filter wheel for carrying a filter media that covers the air intake port and the exhaust port. The filter wheel moves relative to the air intake port and the exhaust port. The system also comprises at least one agitation mechanism for dislodging any particulate matter entrapped in the filter media.

According to a fourth aspect of the present invention, an equipment cooling system comprises an equipment enclosure for housing predetermined equipment to be cooled. The equipment enclosure comprises an air intake port and an exhaust port. The system comprises a filter media wheel for carrying a filter media that covers the air intake port and the exhaust port. The filter media wheel moves relative to the air intake port and the exhaust port. The system also comprises a dither mechanism for dithering the movement applied to the filter media wheel to dislodge particulate matter entrapped therein.

According to a fifth aspect of the present invention, an equipment container cooling apparatus comprises an air intake port through which air is inducted into the equipment container. The apparatus comprises an air outlet port through which air is expelled from the equipment container. The apparatus comprises a filter having a first side and a second side. The apparatus also comprises structure configured to cause relative movement between the filter, the air intake port and the air outlet port, such that (i) air enters from the first side of the filter to the second side of the filter and (ii) air exits from the second side of the filter to the first side of the filter, thereby creating a single air flow path for cooling the equipment container and discharging exhaust through the filter to dislodge any particulate matter entrapped in the filter.

According to a sixth aspect of the present invention, a method for cooling an equipment enclosure comprises the steps of: (i) covering an air intake port and an air exhaust port of the equipment enclosure with a predetermined filter media; (ii) moving the predetermined filter media relative to the air intake port and the air exhaust port; and (iii) creating a single air flow path for equipment cooling by inducting air into the equipment enclosure through the air intake port and predetermined filter media, and for dislodging particulate matter entrapped in the predetermined filter media by expelling exhaust from the equipment enclosure through the air exhaust port and predetermined filter media.

By utilizing a single air flow path for both the equipment cooling and cleaning of the filter, the self-cleaning filter in accordance with exemplary embodiments of the present invention is less complex and less expensive than known self-cleaning systems.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

The present invention relates to a self-cleaning filter and cooling system used to cool the interior of an equipment enclosure with ambient air. In accordance with an exemplary embodiment of the present invention, a single air flow path is used both for cooling the interior of the equipment enclosure and for cleaning the filter. Consequently, the self-cleaning filter and cleaning system according to exemplary embodiments is less complex and expensive than known self-cleaning systems.

Figure 1:
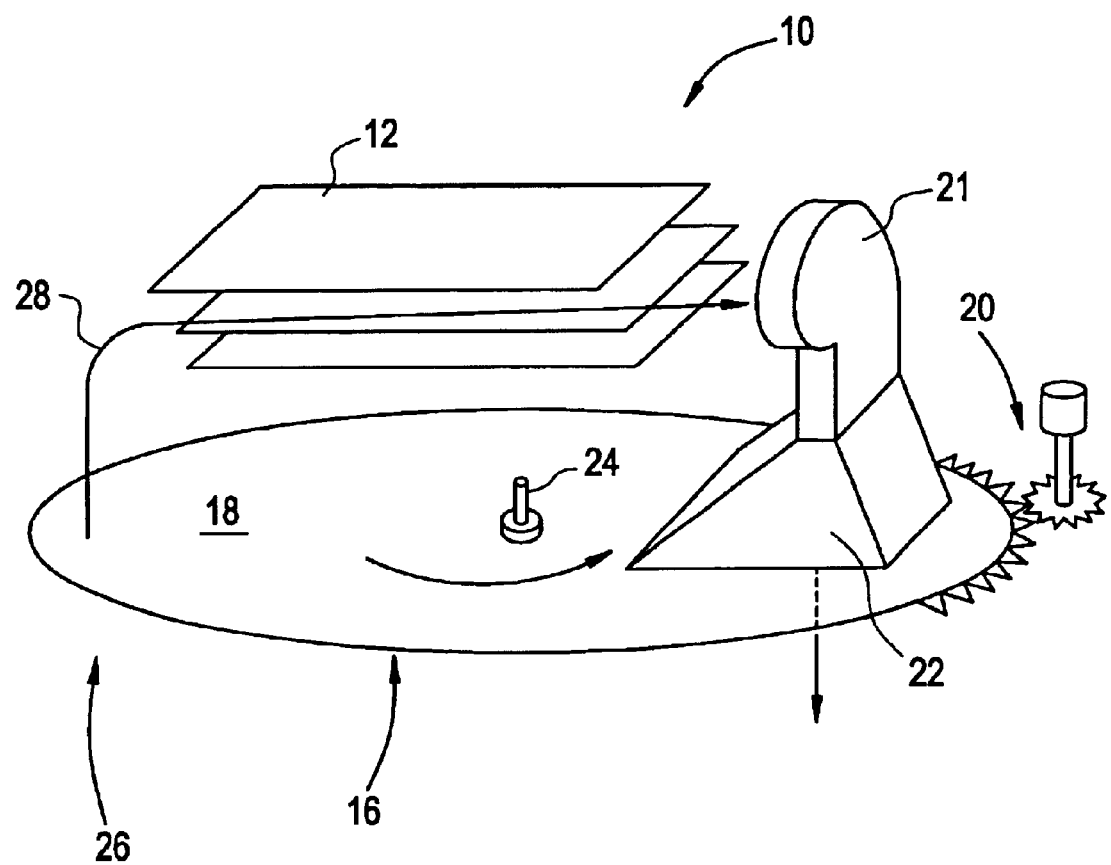
FIG. 1 is a perspective view of a simplified diagram of a self-cleaning filter and cleaning system (shown with the equipment enclosure removed), in accordance with an exemplary embodiment of the present invention.
Figure 2:
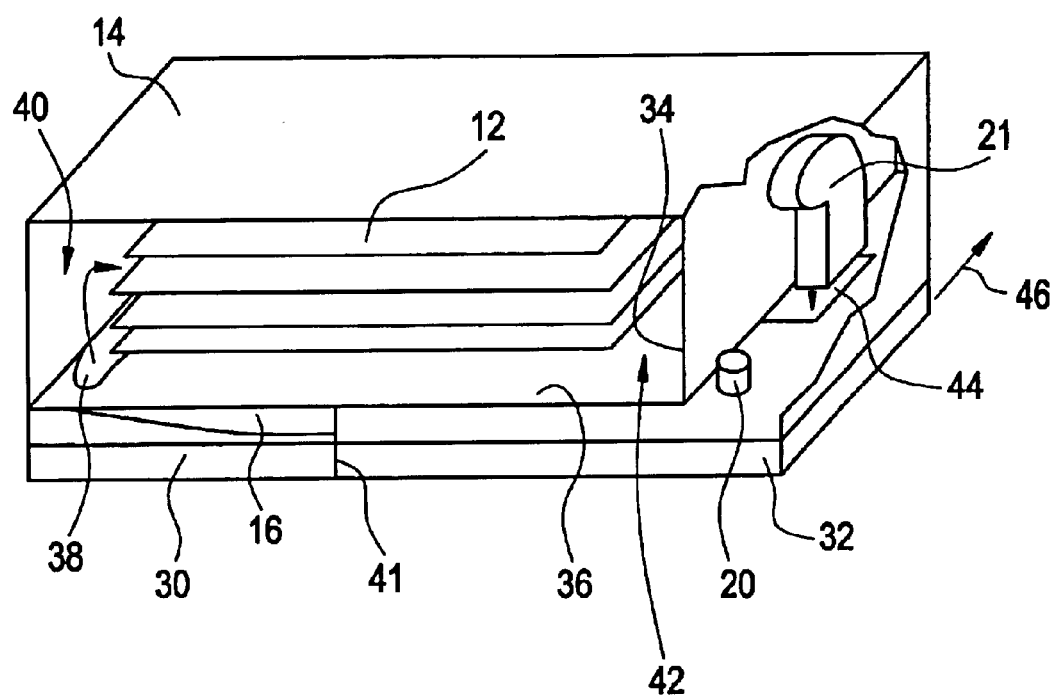
FIG. 2 is a perspective view of a self-cleaning filter and cooling system (shown partially broken away for illustration), in accordance with an exemplary embodiment of the present invention.

These and other aspects of the present invention will now be described in greater detail. An exemplary embodiment of the self-cleaning filter and cooling system is illustrated in FIGS. 1 and 2. In particular, FIG. 1 is a perspective view of a simplified diagram of a self-cleaning filter and cleaning system (shown with the equipment enclosure removed for purposes of clarity), in accordance with an exemplary embodiment of the present invention. FIG. 2 is a perspective view of a self-cleaning filter and cooling system (shown partially broken away for illustration), in accordance with an exemplary embodiment of the present invention. As shown in FIG. 2, like reference numerals are used to denote like objects relative to FIG. 1. Although the invention is described and illustrated in an application of cooling printed circuit boards mounted within an equipment enclosure, exemplary embodiments can be used for cooling any type of equipment disposed within the interior of any type of equipment enclosure.

Referring to FIG. 1, the self-cleaning filter and cooling system 10 is shown in an application of cooling printed circuit boards, arranged horizontally and generally identified with the reference numeral 12. These printed circuit boards 12 are disposed within an equipment enclosure 14 (FIG. 2) and cooled by forced flow of filtered ambient air. The self-cleaning filter and cooling system 10 includes a filter media wheel 16 with a suitable filter media 18, a drive mechanism 20, a blower 21, an intake port 38 (FIG. 2) and an exhaust outlet, which can be a duct or nozzle 22, as shown in FIG. 1, or simply an exhaust opening port 44, as shown in FIG. 2. The filter media wheel 16 can be mounted on a shaft 24 and rotated or otherwise moved by the drive mechanism 20. The drive mechanism 20 can be, for example, a direct drive, as shown, that includes, for example, a drive motor and gear arrangement, or an indirect drive that includes, for example, a belt. According to exemplary embodiments, the drive motor can be, for example, an electric motor. However, those of ordinary skill in the art will recognize that the size, type, horsepower, and other characteristics of the drive motor will depend upon factors such as, for example, the size or volume of the equipment enclosure to be cooled, the size of the filter media wheel 16, and the like.

As shown, unfiltered ambient air enters the equipment volume from a direction identified with the arrow 26. The filter media wheel 16 filters particulate matter from the ambient air and enables the filtered ambient air to pass into the interior of the equipment enclosure, generally identified with the arrow 28.

As will be discussed in more detail below, the equipment to be cooled, in this case, the printed circuit boards 12, can be located between the air intake and the exhaust. In such a configuration, ambient air entering the equipment enclosure can be passed over the entire length of the printed circuit boards 12. More particularly, when the blower 21 is operated, the ambient air can be placed in motion across the entire length of the printed circuit boards 12 and discharged. In the exemplary embodiment illustrated in FIG. 1, exhaust air from the blower 21 can be discharged into the exhaust nozzle 22, disposed adjacent to the filter media 18. Thus, any particulate matter temporarily trapped in the filter media 18 can be dislodged and discharged back into the atmosphere.

The exhaust nozzle 22 can be formed with a relatively smaller cross section than the air intake. In such a configuration, a relatively high velocity and/or higher pressure air stream can be created at the exhaust for dislodging embedded particulate matter in the filter media 18.

The filter media wheel 16 can be formed with a frame (not shown) and covered with a filter media. Various filter media can be suitable depending on the particular environment in which the self-cleaning and cooling system 20 is used. The particle size to which the filter media is permeable will depend on the application (e.g., to avoid diffraction in an optical system) and the environment in which exemplary embodiments of the present invention are used, for example, as it may be necessary to exclude sub-micron particles. For purposes of illustration and not limitation, to meet the requirements specified in Telcordia NEBS (Network Equipment Building System) GR-78-CORE, "Generic requirements for the Physical Design and Manufacture of Telecommunications Products and Equipment," the filter media 18 can be selected to trap particles having a particle size, for example, greater than or equal to two microns for equipment-room environments. However, the filter media 18 can be selected to trap particles of any size.

The blower 21 can be any conventional blower (e.g., an electric blower) having a CFM (cubic foot per minute) capacity commensurate with the size of the equipment enclosure volume to be cooled and desired heat transfer characteristics.

An exemplary embodiment of the invention is illustrated in FIG. 2. As shown in FIG. 2, the equipment enclosure 14 is generally rectangular in shape and is shown with a front panel removed and a side panel partially broken away to permit viewing of the various elements within the enclosure 14.

The configuration of the equipment enclosure 14, shown in FIG. 2, is exemplary and illustrates telecommunications equipment utilized in, for example, a telecommunications central office. The exemplary equipment enclosure 14 can be compartmentalized and can include an inlet compartment 30 and an outlet compartment 32, arranged side-by-side, and an equipment compartment 34 that can be vertically stacked thereupon. The equipment compartment 34 can form a card cage for carrying the printed circuit boards 12 in a vertically stacked configuration. The floor 36 of the card cage can be provided with an air inlet opening or port 38, for example, an elongated slot, disposed adjacent to one end of the printed circuit boards 12. The printed circuit boards 12, in turn, are mounted relatively close to the front and rear walls (not shown) of the card cage. The volume within the card cage, directly above the air inlet port 38, forms an air inlet plenum 40. Such a configuration forces filtered ambient air entering the air inlet plenum 40 to flow over the printed circuit boards 12 to absorb heat from the circuits thereupon.

The blower 21 can be rigidly mounted on an opposing end of the equipment enclosure 14. Although shown as mounted on the interior of the equipment enclosure 14, the blower 21 can be mounted anywhere in the air path (e.g., exterior to the filter media wheel 16), so long as the blower 21 is proximal to the filter media wheel 16. A volume 42 can be provided between the end of the printed circuit boards 12 and a sidewall of the equipment to form an exhaust plenum. The blower 21 can be configured to draw filtered air across the printed circuit boards 12 in a horizontal direction. An exhaust port or opening 44 can be formed in the floor 36 of the card cage. The exhaust port 44 can be used to return filtered ambient air, warmed by the circuits on the printed circuit board, to the compartment 32. The filter media wheel 16 can be disposed beneath the floor 36 and rotated or otherwise moved under the influence of the drive mechanism 20, while simultaneously covering both the air intake port 38 and the exhaust port 44.

As shown, the compartment 32 can be closed in front and open in back to enable warmed exhaust air to be expelled from the rear of the equipment enclosure housing 14, as generally indicated by the arrow 46. In the exemplary embodiment illustrated in FIG. 2, the compartments 30 and 32 can be segregated by a barrier 41. In such a configuration, unfiltered ambient air entering the compartment 30 through the front of the equipment enclosure 14 can be expelled from the rear of the equipment enclosure 14 in the direction of the arrow 46. By segregating the air intake and exhaust, the heat transfer efficiency of the system is enhanced.

In accordance with an exemplary embodiment of the invention, the exhaust port 44, formed in the floor 36 of the card cage, can be coupled to a duct or nozzle (not shown) having a significantly smaller cross sectional area than the air intake port or opening 38. Accordingly, the exhaust air that exits through the filter media 18 will have a relatively higher velocity compared with the air which entered the filter media 18, thus ensuring expulsion of particulate matter collected on the filter media 18. Thus, any arbitrary area of the filter media 18, exposed to the inducted ambient air that becomes laden with particulate matter can be restored when the particulate matter are dislodged by the comparatively higher velocity exhaust air.

According to exemplary embodiments, in operation, the filter media wheel 16 moves relative to the air inlet port 38 and exhaust port 44. For example, the filter media wheel 16 can rotate substantially continually, driven by the drive mechanism 20. However, the filter can move relative to the air intake port and air exhaust port (e.g., air inlet opening 38 and exhaust port 44) in any manner that allows for a single air flow path and that allows particulate matter to be dislodged from the filter. For example, the filter can be not only in the form of a wheel or disc that rotates or otherwise spins, but can also be in the form of a belt that turns, a tube or sphere that spins or rotates on an axis, or any other type of configuration and relative movement that allows for a single air flow path and that allows particulate matter to be dislodged from the filter.

When the blower 21 is on, outside unfiltered ambient air is inducted into the compartment 20 and, in turn, into the air intake plenum 40 by way of the air intake opening 38. Particulate matter from the ambient air is removed and becomes entrapped in the filter media 18. The filtered ambient air is placed in motion by the blower 21 and flows across the printed circuit boards 12, where it is warmed. Warmed, filtered, ambient air is then directed to the exhaust opening 44 and into the compartment 22 and out the rear of the equipment enclosure 14, as indicated by the arrow 46, thus forming a single air flow path. As discussed above, since the air velocity of the exhaust air is relatively higher than the intake air, any particulate matter that becomes entrapped in the filter media 18 is dislodged and expelled back into the environment, thus providing a self-cleaning filter and cooling system in accordance with exemplary embodiments of the present invention.

Figure 3A:
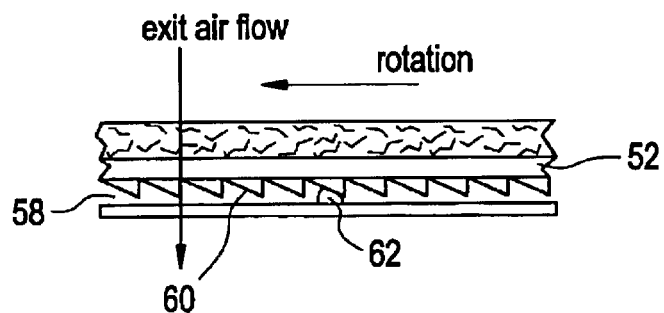
FIG. 3A is a partial edge view of a filter media wheel, in accordance with an alternative exemplary embodiment of the present invention.
Figure 3B:
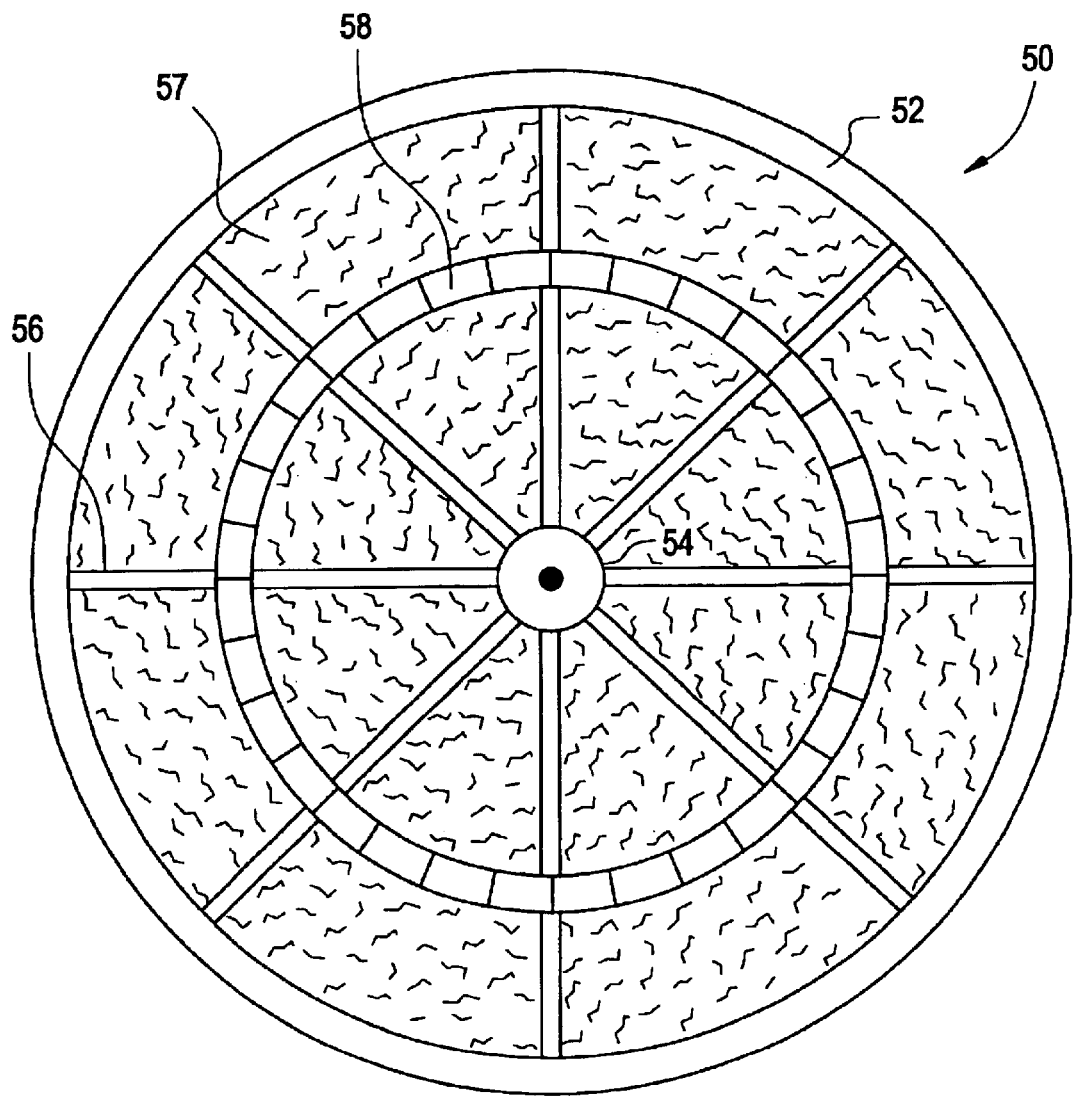
FIG. 3B is a plan view of the filter media wheel illustrated in FIG. 3A.

FIGS. 3A and 3B illustrate an alternative exemplary embodiment of the present invention. According to an alternative exemplary embodiment, in addition to, or in place of, the high velocity exhaust for removing particulate matter from the filter media 18, an agitation mechanism, such as a tapping and/or dither mechanism, can be used. For example, FIGS. 3A and 3B illustrate a tapping mechanism formed from an alternative filter media wheel 50. In this exemplary embodiment, the filter media wheel 50 includes an elastically flexible support structure comprising a rim 52, a hub 54 and a plurality of radially-extending spokes, generally identified with the reference numeral 56 for carrying filter media 57. Concentric to the rim 52 is a circular toothed ring 58. The toothed ring 58 includes a plurality of axially-extending teeth 60, formed as ramped steps. These teeth 60 can be adapted to alternately engage a protuberance 62, rigidly mounted to the equipment housing 14 in radial alignment with the aperture or nozzle for exhaust air. By constraining either the rim 52 or the hub 54 or both, the cooperation of the toothed ring 58 with the protuberance 62 can form a tapping mechanism for removing particulate matter from the filter media 18 in the filter media wheel 50 and alternatively deforming and allowing the filter media wheel 50 to return to its at-rest configuration.

According to this alternative exemplary embodiment, in operation, as the filter media wheel 50 moves relative to the air inlet opening 38 and exhaust port 44, the circular toothed ring 58 and, accordingly, the filter media wheel 50 are elastically deformed as each tooth 60 is deflected by the protuberance 62. The configuration of the teeth 60 allows the filter media wheel 50 to return to its at-rest configuration after the protuberance 62 engages the peak of each tooth 60. The filter media 18 de-accelerates abruptly when the protuberance 62 contacts the base of the next tooth 60, thus aiding dislodgment and consequent expulsion of the particulate matter in a direction of the exhaust air flow from the filter media.

In another alternative exemplary embodiment of the invention, dislodgment and subsequent expulsion of the particulate matter from the filter media 18 into the exhaust air stream can also be accomplished by dithering. For example, a rapidly-reversing angular acceleration can be applied to the otherwise substantially continuous angular velocity or relative movement of the filter media wheel 16, 50. This alternative exemplary embodiment of applying regular, abrupt, angular acceleration pulses can include, for example, an elastic drive and an escapement mechanism.

As an example of an elastic drive and escapement mechanism, a spring or other axial elastic element, connected to, for example, the shaft of the drive motor, can be used in which torsional energy is progressively stored from the motor. The opposite or distal end of the spring can be momentarily inhibited from rotating or otherwise moving the filter media wheel 16, 50 by an escapement, such as, for example, a toothed perimeter or gear engaging a spring-loaded cam (e.g., a ball and spring). When the torsional force from the drive spring exceeds the restraining force of the escapement, the escapement releases the distal end of the spring and allows the filter media wheel 16, 50 to rotate or otherwise move one radial increment, such as, for example, snapping to the next tooth, which causes an abrupt acceleration of the filter media wheel 16, 50. A portion of the spring strain energy is thereby released, again lowering the resultant torque below the escapement threshold. The escapement mechanism can be embodied either separately from or integrally with the filter media wheel 16, 50.

Alternatively, a dither mechanism can be used by appropriate selection of the drive motor power. For example, an otherwise continuous drive motor power can be periodically replaced with a burst of symmetric and rapid maximum acceleration motor reversals to dither the filter media wheel 16, 50 and dislodge particulates so that they can be swept out by exhaust air. The dithering mechanism can be used either by itself or in combination with one or more of the exemplary embodiments discussed previously.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents, foreign patents, and publications discussed above are hereby incorporated herein by reference in their entireties.

What is claimed is:

1. An equipment cooling system, comprising:
    an enclosure for housing predetermined equipment to be cooled, the enclosure including an air intake port and an exhaust port;
    a blower configured to cause ambient air to be inducted into the enclosure through the air intake port and expelled from the exhaust port; and
    a filter that includes a predetermined filter media that covers the air intake port and the exhaust port,
        wherein the filter moves relative to the air intake port and the exhaust port,
        wherein the enclosure and blower are configured so as to create a single air flow path for equipment cooling and for discharging exhaust through the filter media to dislodge any particulate matter lodged in the filter media.

2. The system as recited in claim 1, wherein the equipment enclosure is configured so that the equipment to be cooled is disposed between the air intake port and the exhaust port.

3. The system as recited in claim 1, wherein the system is configured so that the air velocity of the exhaust port is greater than the air velocity of the air intake port.

4. The system as recited in claim 1, wherein the equipment enclosure is configured to house telecommunications equipment.

5. The system as recited in claim 4, wherein the telecommunications equipment comprises printed circuit boards.

6. The system as recited in claim 1, comprising an agitation.

7. The system as recited in claim 6, wherein the agitation mechanism comprises a tapping mechanism for tapping the filter to dislodge particulate matter entrapped therein.

8. The system as recited in claim 6, wherein the agitation mechanism comprises a dither mechanism for dithering the filter to dislodge particulate matter entrapped therein.

9. The system as recited in claim 1, comprising a nozzle disposed at the exhaust port.

10. An equipment cooling system, comprising:
    an equipment enclosure defining an equipment compartment and configured to carry electronic equipment to be cooled, the equipment compartment formed with an air intake port and an exhaust port;

a blower disposed in fluid communication with the air intake port and the exhaust port defining a single air flow path; and a filter which simultaneously covers the air intake port and the exhaust port, wherein the filter moves relative to the air intake port and the exhaust port, the system being configured so that the exhaust air from the equipment enclosure is directed to a portion of the filter.

11. The system as recited in claim 10, wherein the equipment enclosure comprises at least one compartment disposed proximal to the equipment compartment.

12. The system as recited in claim 11, wherein first and second side-by-side compartments are formed proximal to the equipment compartment, and wherein the equipment compartment is in fluid communication with the first compartment and the second compartment.

13. The system as recited in claim 12, wherein the filter is disposed proximal to the equipment compartment.

14. The system as recited in claim 13, wherein exterior openings of the first and second side-by-side compartments are separated from each other on the equipment enclosure.

15. The system as recited in claim 10, wherein the equipment to be cooled comprises printed circuit boards.

16. The system as recited in claim 15, wherein the equipment compartment is sized so that the printed circuit boards are disposed adjacent to two opposing walls and disposed between the air intake port and the exhaust port.

17. The system as recited in claim 10, comprising an agitation mechanism.

18. The system as recited in claim 17, wherein the agitation mechanism comprises a tapping mechanism for tapping the rotating filter to dislodge particulate matter lodged therein.

19. The system as recited in claim 17, wherein the agitation mechanism comprises a dither mechanism for dithering the filter to dislodge particulate matter entrapped therein.

20. An equipment cooling system, comprising:

an equipment enclosure for housing predetermined equipment to be cooled, the equipment enclosure having an air intake port and an exhaust port;

a filter wheel for carrying a filter media that covers the air intake port and the exhaust port, wherein the filter wheel moves relative to the air intake port and the exhaust port; and at least one agitation mechanism for dislodging any particulate matter entrapped in the filter media.

21. The system as recited in claim 20, wherein the at least one agitation mechanism comprises a system for dithering the filter wheel.

22. The system as recited in claim 20, wherein the at least one agitation mechanism comprises a tapping mechanism.

23. The system as recited in claim 22, wherein the tapping mechanism comprises a filter media wheel formed with a flexible support rim, a hub and a plurality of radially-extending spokes for carrying filter media, the filter media wheel constrained at least one of the hub and the flexible support rim and formed with a toothed ring having at least one extending tooth and a fixed protuberance configured to engage the at least one extending tooth and to cause deformation and return to an at-rest position of the filter media wheel.

24. The system as recited in claim 20, wherein the predetermined equipment to be cooled comprises printed circuit boards.

25. An equipment cooling system, comprising:

an equipment enclosure for housing predetermined equipment to be cooled, wherein the equipment enclosure comprises an air intake port and an exhaust port;

a filter media wheel for carrying a filter media that covers the air intake port and the exhaust port, wherein the filter media wheel moves relative to the air intake port and the exhaust port; and a dither mechanism for dithering the movement applied to the filter media wheel to dislodge particulate matter entrapped therein.

26. The system as recited in claim 25, wherein the predetermined equipment to be cooled comprises printed circuit boards.

27. An equipment container cooling apparatus, comprising:

an air intake port through which air is inducted into the equipment container;

an air outlet port through which air is expelled from the equipment container;

a filter having a first side and a second side;

structure configured to cause relative movement between the filter, the air intake port and the air outlet port, such that (i) air enters from the first side of the filter to the second side of the filter and (ii) air exits from the second side of the filter to the first side of the filter, thereby creating a single air flow path for cooling the equipment container and discharging exhaust through the filter to dislodge any particulate matter lodged in the filter.

28. The apparatus as recited in claim 27, wherein the equipment container is configured so that equipment to be cooled is disposed between the air intake port and the air outlet port.

29. The apparatus as recited in claim 27, wherein the apparatus is configured so that the air velocity of the air outlet port is greater than the air velocity of the air intake port.

30. The apparatus as recited in claim 27, comprising an agitation mechanism.

31. The apparatus as recited in claim 30, wherein the agitation mechanism comprises a tapping mechanism for tapping the filter to dislodge particulate matter lodged therein.

32. The apparatus as recited in claim 30, wherein the agitation mechanism comprises a dither mechanism for dithering the filter to dislodge particulate matter lodged therein.

33. A method for cooling an equipment enclosure, comprising the steps of:

covering an air intake port and an air exhaust port of the equipment enclosure with a predetermined filter media;

moving the predetermined filter media relative to the air intake port and the air exhaust port; and creating a single air flow path for equipment cooling by inducting air into the equipment enclosure through the air intake port and predetermined filter media, and for dislodging particulate matter entrapped in the predetermined filter media by expelling exhaust from the equipment enclosure through the air exhaust port and predetermined filter media.

34. The method as recited in claim 33, comprising the step of:
  disposing equipment to be cooled between the air intake port and the air exhaust port.

35. The method as recited in claim 33, wherein an air velocity of the air exhaust port is greater than an air velocity of the air intake port.

36. The method of claim 33, where the step of moving comprises the step of:
  tapping the predetermined filter media to dislodge particulate matter entrapped therein.

37. The method of claim 33, wherein the step of moving comprises the step of:
  dithering the predetermined filter media to dislodge particulate matter entrapped therein.

38. An equipment cooling system, comprising:
  an equipment enclosure defining an equipment compartment and configured to carry electronic equipment to be cooled,
    wherein the equipment compartment includes an intake port and an exhaust port;
  a blower disposed in fluid communication with the intake port and the exhaust port defining a single flow path; and
  a filter that simultaneously covers the intake port and the exhaust port,
    wherein the filter moves relative to the intake port and the exhaust port,
    wherein the system is configured so that exhaust from the equipment enclosure is directed to a portion of the filter to create the single flow path for equipment cooling and for discharging exhaust through the filter to dislodge any particulate matter lodged in the filter.

39. The system of claim 38, wherein the equipment enclosure comprises at least one compartment disposed proximal to the equipment compartment.

40. The system of claim 39, wherein first and second side-by-side compartments are formed proximal to the equipment compartment, and
  wherein the equipment compartment is in fluid communication with the first compartment and the second compartment.

41. The system of claim 40, wherein the filter is disposed proximal to the equipment compartment.

42. The system of claim 41, wherein exterior openings of the first and second side-by-side compartments are separated from each other on the equipment enclosure.

43. The system of claim 38, wherein the equipment to be cooled comprises printed circuit boards.

44. The system of claim 43, wherein the equipment compartment is sized so that the printed circuit boards are disposed adjacent to two opposing walls and disposed between the intake port and the exhaust port.

45. The system of claim 38, comprising an agitation mechanism.

46. The system of claim 45, wherein the agitation mechanism comprises a tapping mechanism for tapping the filter to dislodge particulate matter lodged therein.

47. The system of claim 45, wherein the agitation mechanism comprises a dither mechanism for dithering the filter to dislodge particulate matter entrapped therein.

48. An equipment cooling system, comprising:
  an equipment enclosure for housing predetermined equipment to be cooled,
    wherein the equipment enclosure includes an intake port and an exhaust port;
  a filter wheel for carrying a filter media that covers the intake port and the exhaust port,
    wherein the filter wheel moves relative to the intake port and the exhaust port so as to create a single flow path for equipment cooling and for discharging exhaust through the filter media to dislodge any particulate matter lodged in the filter media; and
  at least one agitation mechanism for dislodging particulate matter entrapped in the filter media.

49. The system of claim 48, wherein the at least one agitation mechanism comprises a system for dithering the filter wheel.

50. The system of claim 48, wherein the at least one agitation mechanism comprises a tapping mechanism.

51. The system of claim 50, wherein the tapping mechanism comprises a filter media wheel formed with a flexible support rim, a hub and a plurality of radially-extending spokes for carrying filter media,
  wherein the filter media wheel is constrained at least one of the hub and the flexible support rim and fanned with a toothed ring having at least one extending tooth and a fixed protuberance configured to engage the at least one extending tooth and to cause deformation and return to an at-rest position of the filter media wheel.

52. The system of claim 48, wherein the predetermined equipment to be cooled comprises printed circuit boards.

53. An equipment cooling system, comprising:
  an equipment enclosure for housing predetermined equipment to be cooled,
    wherein the equipment enclosure comprises an intake port and an exhaust port;
  a filter media wheel for carrying a filter media that covers the intake port and the exhaust port,
    wherein the filter media wheel moves relative to the intake port and the exhaust port so as to create a single flow path for equipment cooling and for discharging exhaust through the filter media to dislodge any particulate matter lodged in the filter media; and
  a dither mechanism for dithering the movement applied to the filter media wheel to dislodge particulate matter entrapped therein.

54. The system of claim 53, wherein the predetermined equipment to be cooled comprises printed circuit boards.

* * * * *